United States Patent
Nguyen et al.

(10) Patent No.: US 10,746,758 B2
(45) Date of Patent: Aug. 18, 2020

(54) MEMS-BASED SENSOR SUITE

(71) Applicant: HRL LABORATORIES, LLC, Malibu, CA (US)

(72) Inventors: Hung Nguyen, Los Angeles, CA (US); David T. Chang, Calabasas, CA (US); Raviv Perahia, Agoura Hills, CA (US); Logan D. Sorenson, Thousand Oaks, CA (US)

(73) Assignee: HRL Laboratories, LLC, Malibu, CA (US)

( * ) Notice: Subject to any disclaimer, the term of this patent is extended or adjusted under 35 U.S.C. 154(b) by 172 days.

(21) Appl. No.: 15/897,819

(22) Filed: Feb. 15, 2018

(65) Prior Publication Data

US 2018/0238930 A1 Aug. 23, 2018

Related U.S. Application Data

(60) Provisional application No. 62/461,715, filed on Feb. 21, 2017.

(51) Int. Cl.
| | |
|---|---|
| *G01P 15/18* | (2013.01) |
| *G01P 15/08* | (2006.01) |
| *G01P 15/105* | (2006.01) |
| *G01P 15/14* | (2013.01) |
| *G01R 33/02* | (2006.01) |
| *G01R 33/00* | (2006.01) |
| *G01C 19/5783* | (2012.01) |
| *G01C 21/16* | (2006.01) |
| *G01C 17/28* | (2006.01) |

(52) U.S. Cl.
CPC ............. *G01P 15/18* (2013.01); *G01C 17/28* (2013.01); *G01C 19/5783* (2013.01); *G01C 21/165* (2013.01); *G01P 15/0802* (2013.01); *G01P 15/105* (2013.01); *G01P 15/14* (2013.01); *G01R 33/0005* (2013.01); *G01R 33/0206* (2013.01)

(58) Field of Classification Search
CPC ...... G01P 15/18; G01C 19/5783; G01C 25/00
See application file for complete search history.

(56) References Cited

U.S. PATENT DOCUMENTS

| | | |
|---|---|---|
| 4,656,750 A | 4/1987 | Pitt et al. |
| 4,711,125 A | 12/1987 | Morrison |
| 9,213,046 B2 | 12/2015 | Wang |

(Continued)

OTHER PUBLICATIONS

International Search Report and Written Opinion for International Application No. PCT/US2018/018378, dated May 24, 2018, 15 pages.

(Continued)

*Primary Examiner* — Tarun Sinha
(74) *Attorney, Agent, or Firm* — Lewis Roca Rothgerber Christie, LLP

(57) ABSTRACT

A microelectromechanical (MEMS) sensor suite including a three axis accelerometer including an accelerometer sensor polyhedron having a series of faces, and a series of axial accelerometers on three faces of the series of faces of the accelerometer sensor polyhedron. The MEMS sensor suite also includes a three axis magnetometer including a magnetometer sensor polyhedron having a series of faces, and a series of axial magnetometers on three faces of the series of faces of the magnetometer sensor polyhedron.

24 Claims, 5 Drawing Sheets

(56) References Cited

U.S. PATENT DOCUMENTS

| | | | |
|---|---|---|---|
| 2005/0155415 A1* | 7/2005 | Kurowski | A61B 5/14532 |
| | | | 73/54.02 |
| 2009/0308157 A1 | 12/2009 | Eriksen et al. | |
| 2011/0061454 A1* | 3/2011 | Vornbrock | E21B 7/046 |
| | | | 73/152.58 |
| 2012/0032286 A1 | 2/2012 | Trusov et al. | |
| 2016/0047675 A1* | 2/2016 | Tanenhaus | G01C 25/005 |
| | | | 702/104 |

OTHER PUBLICATIONS

Zotov et al., "Chip-Scale IMU Using Folded-MEMS Approach," IEEE Sensors, pp. 1043-1046, 2010.

* cited by examiner

MEMS-BASED SENSOR SUITE

CROSS-REFERENCE TO RELATED APPLICATION(S)

The present application claims priority to and the benefit of U.S. Provisional Application No. 62/461,715, filed Feb. 21, 2017, entitled "MEMS-based Inertial Measurement Unit (IMU) sensor suite for downhole navigation," the entire content of which is incorporated herein by reference.

FIELD

The present disclosure relates generally to Inertial Measurement Unit sensor suites.

BACKGROUND

As illustrated in FIG. 1, related art sensor systems 100 utilized for navigation, such as Attitude and Heading Reference Systems (AHRS) and Inertial Navigation Systems (INS), typically include a linear stack of discrete, uniaxial sensors. The related art sensor system 100 illustrated in FIG. 1 includes a housing or a chassis 101 housing a linear stack of three uniaxial accelerometers 102 stacked on top of a linear stack of three uniaxial magnetometers 103. Stacking the sensors 102, 103 in a linear arrangement results in a relatively large volumetric package or envelope of the sensor system 100. For instance, related art measurement while drilling (MWD) survey tools utilized in the oil and gas industry are typically confined to a 1.875 inch outer diameter chassis 101 that fits inside a 3.5 inch drill collar, and the axial arrangement of the sensors 102, 103 and corresponding electronics housed in the chassis 101 may have a length extending over 2 feet along an axis of the chassis 101. Additionally, the relatively large volumetric size of the related art sensor system 100 may result in relatively high cost, weight, and power consumption, and may inhibit the sensor system 100 from being positioned in an optimal location.

The significant spacing between the sensors 102, 103 in the related art sensor system 100 may also result in positional errors or uncertainties when the output signal of the sensor system 100 is utilized by a navigation algorithm because navigation algorithms typically assume a single point location of the sensor system 100. Although pre-operational calibration may be performed to compensate for the fixed offsets between the sensors 102, 103, the related art sensor system 100 is also subject to deformation during use (e.g., during a drilling operation), which may require more complex real-time calibration to compensate for positional errors or uncertainties caused by the deformation of the sensor system 100.

Moreover, the related art sensor system 100 is also sensitive to external environmental stimuli, such as thermal and mechanical gradients across the sensor system 100, due to the relatively large volumetric size of the sensor system 100 and the spacing between the sensors 102, 103. For instance, different thermal or mechanical loads (e.g., stresses) on different portions of the sensor system 100 may alter the output of the sensor system 100 depending on the distribution of the thermal and mechanical loads across the sensor system 100. These spatially-dependent effects exhibited by the related art sensor system 100 may result in positional errors and uncertainties when the sensor system 100 is incorporated into a navigation system.

SUMMARY

The present disclosure is directed to various embodiments of a micro-electro-mechanical system (MEMS)-based sensor suite. In one embodiment, the MEMS-based sensor suite includes a triaxial accelerometer including an accelerometer sensor polyhedron having a series of faces, and a series of axial accelerometers on three faces of the series of faces of the accelerometer sensor polyhedron. The MEMS sensor suite also includes a triaxial magnetometer including a magnetometer sensor polyhedron having a series of faces, and a series of axial magnetometers on three faces of the series of faces of the magnetometer sensor polyhedron.

The accelerometer sensor polyhedron may be a cube, and the three faces of the accelerometer sensor polyhedron may be three mutually orthogonal faces.

The magnetometer sensor polyhedron may be a cube, and the three faces of the magnetometer sensor polyhedron may be three mutually orthogonal faces.

The accelerometer sensor cube may have a volume of approximately (about) 1 in$^3$ and the magnetometer sensor cube may have a volume of approximately (about) 1 in$^3$. Each axial accelerometer of the series of axial accelerometers may have an area of approximately (about) 0.65 in×0.65 in, and each axial magnetometer of the series of axial magnetometers may have an area of approximately (about) 0.65 in×0.65 in.

The MEMS sensor suite may also include a three axial gyroscope including a gyroscope sensor polyhedron having a series of faces, and a series of axial gyroscopes on three faces of the series of faces of the gyroscope sensor polyhedron.

The gyroscope sensor polyhedron may be a cube, and the three faces of the gyroscope sensor polyhedron may be three mutually orthogonal faces.

The accelerometer sensor polyhedron may include a flex circuit or a rigid flex printed circuit board. The accelerometer sensor polyhedron may include the rigid flex printed circuit board, and the series of axial accelerometers may be electrically connected together by signal routing wires extending through flexible hinges of the rigid flex printed circuit board.

The magnetometer sensor polyhedron may include a flex circuit or a rigid flex printed circuit board. The magnetometer sensor polyhedron may include the rigid flex printed circuit board, and the series of axial magnetometers may be electrically connected together by signal routing wires extending through flexible hinges of the rigid flex printed circuit board.

The MEMS sensor suite may include a front-end board, and the accelerometer sensor polyhedron and the magnetometer sensor polyhedron may be mounted on the front-end board.

The MEMS sensor suite may include a series of electronic components on the three faces of the accelerometer sensor polyhedron, such as signal amplifiers, filters, and/or analog-to-digital converters.

The MEMS sensor suite may include a series of electronic components on the three faces of the magnetometer sensor polyhedron, such as signal amplifiers, filters, and/or analog-to-digital converters.

The present disclosure is also directed to various methods of manufacturing a MEMS sensor suite. In one embodiment, the method includes connecting a series of sensors to a circuit and folding the circuit into a sensor polyhedron having a series of faces. The series of sensors are on three faces of the series of faces of the sensor polyhedron.

The sensor polyhedron may be a cube and the three faces may be three mutually orthogonal faces.

Folding the circuit into the sensor polyhedron may include positioning the series of sensors connected to the circuit between a folding fixture and a press. The folding fixture defines a cubic cavity and an opening in communication with the cubic cavity. Folding the circuit into the sensor polyhedron may also include moving the press and the folding fixture relatively toward each other and pressing the series of sensors and the circuit into the cubic cavity through the opening in the folding fixture. Pressing the series of sensors and the circuit into the cubic cavity conforms the circuit to a shape of the cubic cavity.

The circuit may be a flex circuit or a rigid flex printed circuit board, and the sensors may include a series of axial accelerometers, a series of axial magnetometers, and/or a series of gyroscopes.

The press may be a solid cube having a size smaller than a size of the cubic cavity in the folding fixture.

The cubic cavity in the folding fixture may have a volume of approximately (about) 1 in$^3$.

The method may also include mounting the sensor cube on a front-end board.

This summary is provided to introduce a selection of features and concepts of embodiments of the present disclosure that are further described below in the detailed description. This summary is not intended to identify key or essential features of the claimed subject matter, nor is it intended to be used in limiting the scope of the claimed subject matter. One or more of the described features may be combined with one or more other described features to provide a workable device.

BRIEF DESCRIPTION OF THE DRAWINGS

These and other features and advantages of embodiments of the present disclosure will become more apparent by reference to the following detailed description when considered in conjunction with the following drawings. In the drawings, like reference numerals are used throughout the figures to reference like features and components. The figures are not necessarily drawn to scale.

DETAILED DESCRIPTION

Figure 1:
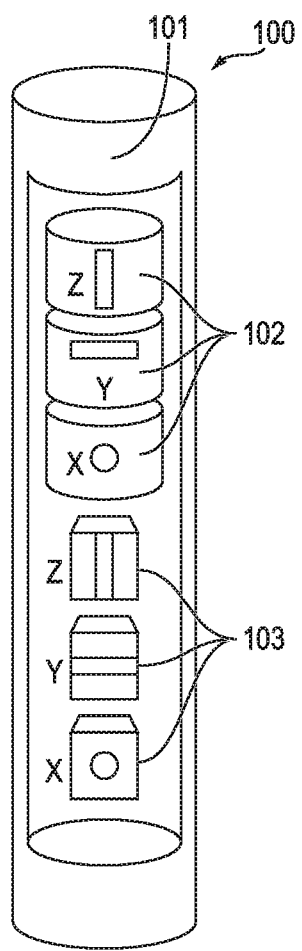
FIG. 1 is a schematic side view of a related art sensor suite including a series of stacked accelerometers and a series of stacked magnetometers.

The present disclosure is directed to various embodiments of a micro-electro-mechanical (MEMS)-based sensor suite configured to provide an inertial measurement. The MEMS-based sensor suite of the present disclosure may be utilized in measurement while drilling (MWD) survey tools used for underground navigation in the oil and gas industry. The MEMS-based sensor suite of the present disclosure may be utilized in any other suitable environment. For instance, the MEMS-based sensor suite of the present disclosure may be utilized in an autonomous or semi-autonomous vehicle navigation system (e.g., the MEMS-based sensor suite may be utilized in driver assistant systems (SAE Level 1) to fully autonomous vehicles (SAE Level 5)). The MEMS-based sensor suite of the present disclosure may provide dead reckoning for vehicle navigation during GPS blackouts periods (e.g., 3 minutes or longer between GPS acquisition) to provide continuous vehicle navigation and/or guidance during the GPS blackout periods. The MEMS-based sensor suite may also be positioned internally in an autonomous or semi-autonomous vehicle to augment or supplant external sensors on the vehicle in environmental conditions where external sensors on the vehicle are impaired (e.g., environmental conditions in which visual cues are difficult for the external sensors to discern). Additionally, the MEMS-based sensor suite of the present disclosure may be utilized to provide navigation in direct impact systems (e.g., small diameter bombs (SMB)) or unmanned aerial vehicles. In one or more embodiments, the MEMS-based sensor suite of the present disclosure may meet the low size, weight, power, and cost (C-SWAP) requirements for compact and power-limited platforms. The MEMS-based sensor suite of the present disclosure may also be utilized to provide navigation and/or guidance in closed systems with minimal or no external references (e.g., GPS or other signals).

The MEMS-based sensor suite of the present disclosure is packaged in a smaller configuration than related art sensor suites. For instance, in one or more embodiments, the MEMS-based sensor suite of the present disclosure may exhibit an approximately 4 times reduction in length and an approximately 1000 times reduction in volume compared to related art sensor suites, which is configured to reduce the cost, weight, and power consumption of the MEMS-based sensor suite compared to related art sensor suites. Reducing the packaging volume of the MEMS-based sensor suite compared to related art sensor suites is also configured to reduce the sensitivity of the MEMS-based sensor suite to external environmental stimuli. For instance, the MEMS-based sensor suite of the present disclosure is configured to reduce spatially-dependent errors, such as errors due to stress and/or temperature gradients across the MEMS-based sensor suite, by minimizing or at least reducing the distance between the sensors in the sensor suite. Additionally, reducing the packaging volume of the MEMS-based sensor suite compared to related art sensor suites is also configured to increase sensor placement accuracy and enable insertion of the MEMS-based sensor suite into optimal locations inaccessible by related art sensor suites.

When the MEMS-based sensor suite of the present disclosure is incorporated into a navigation system that assumes a single point location of the sensor suite, the reduced volumetric size of the MEMS-based sensor suite compared to related art sensor suites is configured to increase the positional accuracy of the navigation system by more closely positioning the sensors of the sensor suite to the single point location. Furthermore, reducing the packaging volume of the MEMS-based sensor suite is configured to reduce deformation of the sensor suite during use (e.g., during a drilling operation) compared to related art sensor suite systems, and this reduction in deformation is configured to increase the accuracy of the output signal of the sensor suite (e.g., increase the accuracy of the location and heading output signal of the sensor suite). The MEMS-based sensor suite of the present disclosure is also configured to reduce sensor-to-sensor misalignments and non-orthogonalities compared to related art sensor suites, which would otherwise contribute to errors or uncertainties in the location and heading output signals of the sensor suite.

Figure 2:
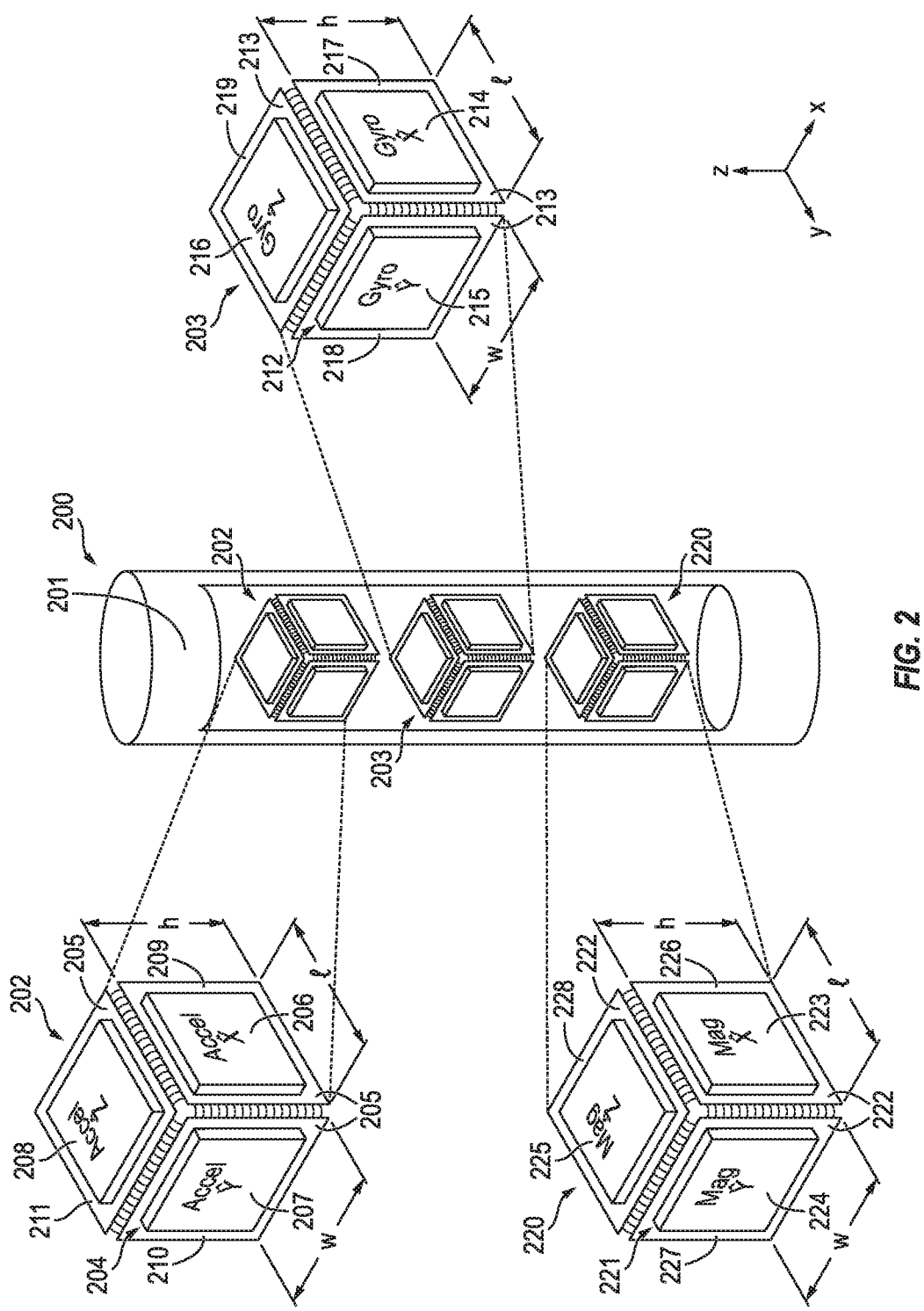
FIG. 2 is a schematic side view of a micro-electro-mechanical (MEMS)-based sensor suite according to one embodiment of the present disclosure.

With reference now to FIG. 2, a MEMS-based sensor suite 200 according to one embodiment of the present disclosure includes a housing or a chassis 201 housing a three axis accelerometer 202, a three axis gyroscope 203, and a three axis magnetometer 220. In the illustrated embodiment, the three axis accelerometer 202 includes an accelerometer sensor polyhedron (e.g., a cube) 204 or die having a series of faces 205 and three uniaxial accelerometers 206, 207, 208 on three faces 205 (e.g., three mutually orthogonal faces) of the accelerometer sensor polyhedron 204. In the illustrated embodiment, the three uniaxial accelerometers 206, 207, 208 include a first MEMS accelerometer 206 configured to measure a vector component of gravity along an x-axis, a second MEMS accelerometer 207 configured to measure a vector component of gravity along a y-axis orthogonal to the x-axis, and a third MEMS accelerometer 208 configured to measure a vector component of gravity along a z-axis orthogonal to both the x-axis and the y-axis. In the illustrated embodiment, the uniaxial MEMS accelerometers 206, 207, 208 are aligned with the x-, y-, and z-axes, respectively, of the accelerometer cube such that the uniaxial MEMS accelerometers 206, 207, 208 have mutually orthogonal orientations. Together, the uniaxial MEMS accelerometers 206, 207, 208 define a triaxial MEMS accelerometer configured to measure or determine an orientation of the three axis accelerometer 202 with respect to the gravitational force of Earth.

With continued reference to the embodiment illustrated in FIG. 2, the faces 205 of the accelerometer sensor polyhedron 204 of the three axis accelerometer 202 are defined by circuits 209, 210, 211 on which the uniaxial MEMS accelerometers 206, 207, 208, respectively, are mounted. In one or more embodiments, each of the circuits 209, 210, 211 may be a flex circuit or a rigid flex printed circuit board. In one or more embodiments, each of the circuits 209, 210, 211 of the three axis accelerometer 202 may also include signal conditioning circuitry proximate (e.g., directly adjacent) the uniaxial MEMS accelerometers 206, 207, 208, respectively. Additionally, in one or more embodiments, the three axis accelerometer 202 may include one or more electronic components on the circuits 209, 210, 211 and coupled the uniaxial MEMS accelerometers 206, 207, 208 for processing the output signal of the uniaxial MEMS accelerometers 206, 207, 208, such as, for instance, an amplifier, a signal filter, an analog-to-digital converter (ADC), or combinations thereof. In one or more embodiments, the three axis accelerometer 202 may include one or more of these electronic components for each of the three uniaxial MEMS accelerometers 206, 207, 208.

Although in one or more embodiments it is referred to herein as a "cube," in one or more embodiments, the accelerometer sensor polyhedron 204 may not be a complete cube and one or more faces 205 of the accelerometer sensor polyhedron 204 may be open. For instance, in one or more embodiments, the accelerometer sensor polyhedron 204 may include three closed faces 205 corresponding to the uniaxial MEMS accelerometers 206, 207, 208 and three open faces.

In one or more embodiments, the accelerometer sensor polyhedron 204 occupies a bulk volume or a total volume of approximately 1 in$^3$ (e.g., the accelerometer sensor cube 204 has a length l of approximately 1 in, a width w of approximately 1 in, and a height h of approximately 1 in). In one or more embodiments, the uniaxial MEMS accelerometers 206, 207, 208 have a size (e.g., an area) smaller than the faces 205 of the accelerometer polyhedron 204. In one embodiment, each of the faces 205 of the accelerometer sensor cube 204 has an area of approximately 1 in$^2$ and each of the uniaxial MEMS accelerometers 206, 207, 208 has an area from approximately 0.3 in$^2$ to approximately 0.7 in$^2$. In one embodiment, each of the faces 205 of the accelerometer sensor polyhedron 204 has an area of approximately 1 in$^2$ and each of the uniaxial MEMS accelerometers 206, 207, 208 has an area of approximately 0.4 in$^2$ (e.g., each of the uniaxial MEMS accelerometers 206, 207, 208 has length of approximately 0.65 inch and a width of approximately 0.65 inch).

With continued reference to the embodiment illustrated in FIG. 2, the three axis gyroscope 203 of the MEMS-based sensor suite 200 includes a gyroscope sensor polyhedron (e.g., a cube) or die 212 having a series of faces 213 and three uniaxial MEMS gyroscopes 214, 215, 216 on three face 213 (e.g., three mutually orthogonal faces) of the gyroscope sensor polyhedron 212. In the illustrated embodiment, the three uniaxial gyroscopes include a first MEMS gyroscope 214 configured to measure a vector component of Earth's rotation along an x-axis, a second MEMS gyroscope 215 configured to measure a vector component of Earth's rotation along a y-axis orthogonal to the x-axis, and a third MEMS gyroscope 216 configured to measure a vector component of Earth's rotation along a z-axis orthogonal to both the x-axis and the y-axis. In the illustrated embodiment, the uniaxial MEMS gyroscope 214, 215, 216 are aligned with the x-, y-, and z-axes, respectively, of the gyroscope sensor polyhedron 212. Together, the uniaxial MEMS gyroscopes 214, 215, 216 define a triaxial MEMS gyroscope configured to measure or determine a heading of the MEMS-based sensor suite 200 with respect to Earth's rotation (e.g., the triaxial MEMS gyroscope may be configured to perform an inclination measurement).

With continued reference to the embodiment illustrated in FIG. 2, the faces 212 of the gyroscope sensor polyhedron 212 of the three axis gyroscope 203 are defined by circuits 217, 218, 219 on which the uniaxial MEMS gyroscopes 214, 215, 216, respectively, are mounted. In one or more embodiments, each of the circuits 217, 218, 219 may be a flex circuit or a rigid flex printed circuit board. In one or more embodiments, each of the circuits 217, 218, 219 of the three axis gyroscope 203 may also include signal conditioning circuitry proximate (e.g., directly adjacent) the uniaxial MEMS gyroscopes 214, 215, 216, respectively. Additionally, in one or more embodiments, the three axis gyroscope 203 may include one or more electronic components on the circuits 217, 218, 219 and coupled the uniaxial MEMS gyroscopes 214, 215, 216 for processing the output signal of the uniaxial MEMS gyroscopes 214, 215, 216, such as, for instance, an amplifier, a signal filter, an analog-to-digital converter (ADC), or combinations thereof. In one or more embodiments, the three axis gyroscope 203 may include one or more of these electronic components for each of the three uniaxial MEMS gyroscopes 214, 215, 216.

Although in one or more embodiments it is referred to herein as a "cube," in one or more embodiments, the gyroscope sensor polyhedron 212 may not be a complete cube and one or more faces 213 of the gyroscope sensor cube 212 may be open. For instance, in one or more embodiments, the gyroscope sensor polyhedron 212 may include three closed faces 213 corresponding to the uniaxial MEMS magnetometers 214, 215, 216 and three open faces.

In one or more embodiments, the gyroscope sensor polyhedron 212 occupies a bulk volume or a total volume of approximately 1 in$^3$ (e.g., the gyroscope sensor cube 212 has a length l of approximately 1 in, a width w of approximately 1 in, and a height h of approximately 1 in). In one or more embodiments, the gyroscope sensor polyhedron 212 has the same or substantially the same size (e.g., volume) as the accelerometer sensor polyhedron 204. In one or more embodiments, the uniaxial MEMS gyroscopes 214, 215, 216 have a size (e.g., an area) smaller than the faces 213 of the gyroscope sensor polyhedron 212. In one embodiment, each of the faces 213 of the gyroscope sensor polyhedron 212 has an area of approximately 1 in$^2$ and each of the uniaxial MEMS gyroscopes 214, 215, 216 has an area from approximately 0.3 in$^2$ to approximately 0.7 in$^2$. In one embodiment, each of the faces 213 of the gyroscope sensor polyhedron 212 has an area of approximately 1 in$^2$ and each of the uniaxial MEMS gyroscopes 214, 215, 216 has an area of approximately 0.4 in$^2$ (e.g., each of the uniaxial MEMS gyroscopes 214, 215, 216 has length of approximately 0.65 inch and a width of approximately 0.65 inch).

With continued reference to the embodiment illustrated in FIG. 2, the three axis magnetometer 220 of the MEMS-based sensor suite 200 includes a magnetometer sensor polyhedron (e.g., a cube) or die 221 having a series of faces 222 and three uniaxial magnetometers 223, 224, 225 on three faces 222 (e.g., three mutually orthogonal faces) of the magnetometer sensor polyhedron 221. In the illustrated embodiment, the three uniaxial magnetometers include a first MEMS magnetometer 223 configured to measure angular velocity about an x-axis (e.g., a roll axis), a second MEMS magnetometer 224 configured to measure angular velocity about a y-axis (e.g., a pitch axis) orthogonal to the x-axis, and a third MEMS magnetometer 225 configured to measure angular velocity about a z-axis (e.g., a yaw axis) orthogonal to both the x-axis and the y-axis. In the illustrated embodiment, the uniaxial MEMS magnetometers 223, 224, 225 are aligned with the x-, y-, and z-axes, respectively, of the magnetometer sensor polyhedron 221. Together, the uniaxial MEMS magnetometers define a triaxial MEMS magnetometer configured to measure or determine magnetic field vector at the MEMS-based sensor suite 200 and the triaxial MEMS magnetometer may be configured to perform an azimuthal measurement. In one or more embodiments, the MEMS-based sensor suite may be provided without the magnetometer 220.

With continued reference to the embodiment illustrated in FIG. 2, the faces 222 of the magnetometer sensor polyhedron 221 of the magnetometer 220 are defined by circuits 226, 227, 228 on which the uniaxial MEMS magnetometers 223, 224, 225, respectively, are mounted. In one or more embodiments, each of the circuits 226, 227, 228 may be a flex circuit or a rigid flex printed circuit board. In one or more embodiments, each of the circuits 226, 227, 228 of the magnetometer 220 may also include signal conditioning circuitry proximate (e.g., directly adjacent) the uniaxial MEMS magnetometers 223, 224, 225, respectively. Additionally, in one or more embodiments, the magnetometer 220 may include one or more electronic components on the circuits 226, 227, 228 and coupled the uniaxial MEMS magnetometers 223, 224, 225 for processing the output signal of the uniaxial MEMS magnetometers 223, 224, 225, such as, for instance, an amplifier, a signal filter, an analog-to-digital converter (ADC), or combinations thereof. In one or more embodiments, the magnetometer 220 may include one or more of these electronic components for each of the three uniaxial MEMS magnetometers 223, 224, 225.

Although in one or more embodiments it is referred to herein as a "cube," in one or more embodiments, the magnetometer sensor polyhedron 221 may not be a complete cube and one or more faces 222 of the magnetometer sensor polyhedron 221 may be open. For instance, in one or more embodiments, the magnetometer sensor polyhedron 221 may include three closed faces 222 corresponding to the uniaxial MEMS magnetometers 223, 224, 225 and three open faces.

In one or more embodiments, the magnetometer sensor polyhedron 221 occupies a bulk volume or a total volume of approximately 1 in$^3$ (e.g., the magnetometer sensor cube 221 has a length l of approximately 1 in, a width w of approximately 1 in, and a height h of approximately 1 in). In one or more embodiments, the magnetometer sensor polyhedron 221 has the same or substantially the same size (e.g., volume) as the accelerometer sensor polyhedron 204 and/or the magnetometer sensor polyhedron 212. In one or more embodiments, the magnetometers 223, 224, 225 have a size (e.g., an area) smaller than the faces of the magnetometer sensor polyhedron 221. In one embodiment, each of the faces 222 of the magnetometer sensor polyhedron 221 has an area of approximately 1 in$^2$ and each of the uniaxial MEMS magnetometers 223, 224, 225 has an area from approximately 0.3 in$^2$ to approximately 0.7 in$^2$. In one embodiment, each of the faces 222 of the magnetometer sensor polyhedron 221 has an area of approximately 1 in$^2$ and each of the uniaxial MEMS magnetometers 223, 224, 225 has an area of approximately 0.4 in$^2$ (e.g., each of the uniaxial MEMS magnetometers 223, 224, 225 has length of approximately 0.65 inch and a width of approximately 0.65 inch).

Figure 3A:
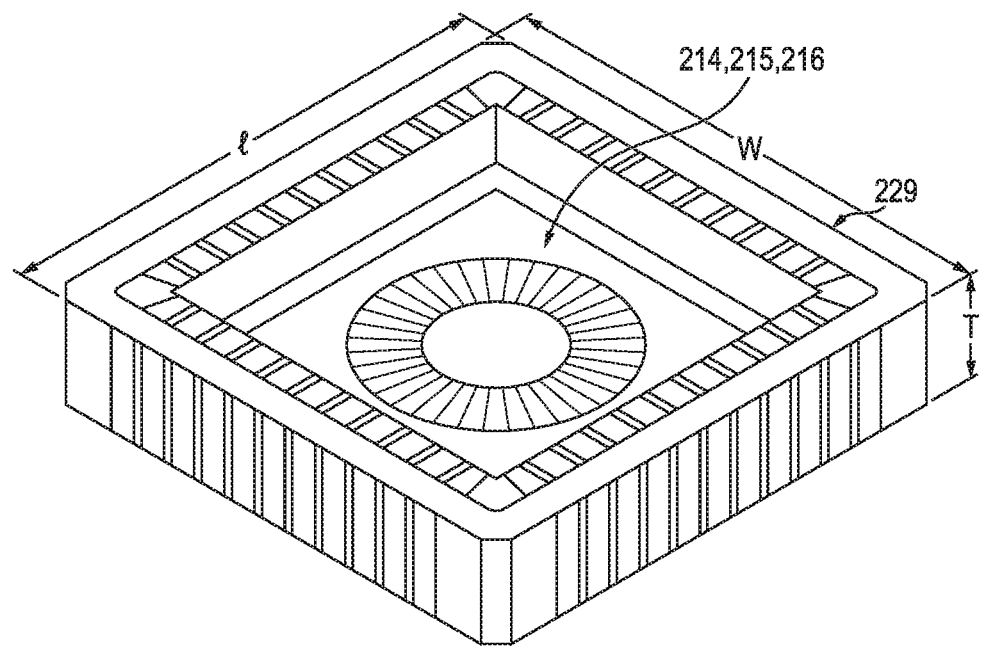
FIG. 3A is a perspective view of a uniaxial MEMS gyroscope according to embodiments of the present disclosure.

FIG. 3A illustrates the uniaxial MEMS gyroscopes 214, 215, 216 of the MEMS-based sensor suite 200 according to one embodiment of the present disclosure. As illustrated in FIG. 3A, each uniaxial MEMS gyroscope 214, 215, 216 is sealed in an individual ceramic leadless chip carrier (LCC) 229. In FIG. 3A, the uniaxial MEMS gyroscope 214, 215, 216 is shown prior to sealing the uniaxial MEMS gyroscope 214, 215, 216 in the LCC 229 with a lid (i.e., the lid is omitted to reveal the uniaxial MEMS gyroscope 214, 215, 216). In one or more embodiments, the area of the LCC 229 is less than or equal to the area of the faces 222 of the gyroscope sensor polyhedron 221. In one embodiment, the LCC 229 has an area of approximately 0.42 in$^2$ (e.g., a length l of approximately 0.65 in and a width w of approximately 0.65 in) and a thickness T of approximately 0.08 in. Additionally, in one or more embodiments, each uniaxial MEMS gyroscope 214, 215, 216 is sealed under vacuum using encapsulated getters (e.g., less than approximately 1 mTorr) to preserve the high quality factors and the sensitivity of the uniaxial MEMS gyroscopes 214, 215, 216. In one or more embodiments, the uniaxial MEMS gyroscopes 214, 215, 216 may be resonant-type MEMS sensors.

Figure 3B:
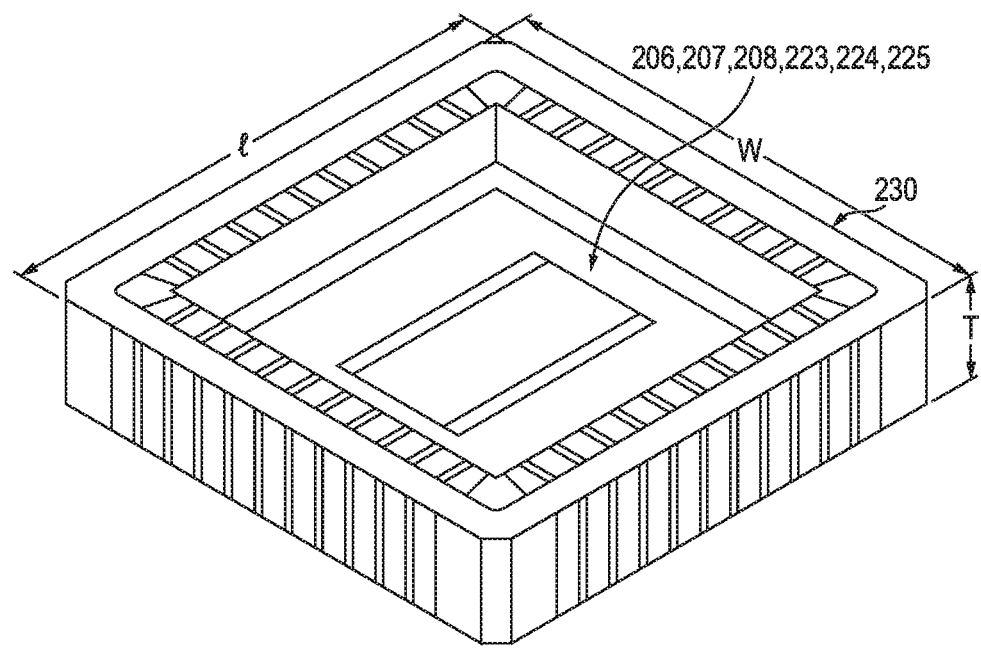
FIG. 3B is a perspective view of a uniaxial MEMS accelerometer and a uniaxial MEMS magnetometer according to embodiments of the present disclosure.

FIG. 3B illustrates the uniaxial MEMS accelerometers 206, 207, 208 and the uniaxial magnetometers 223, 224, 225 of the MEMS-based sensor suite 200 according to one embodiment of the present disclosure. As illustrated in FIG. 3B, each uniaxial MEMS accelerometer 206, 207, 208 and each uniaxial magnetometer 223, 224, 225 is sealed in an individual ceramic leadless chip carrier (LCC) 230. In FIG. 3B, the uniaxial MEMS accelerometer 206, 207, 208 and the uniaxial magnetometer 223, 224, 225 is shown prior to sealing the uniaxial MEMS accelerometer 206, 207, 208 and the uniaxial magnetometer 223, 224, 225 in the LCC 230 with a lid (e.g., the lid is omitted to reveal the uniaxial MEMS accelerometer 206, 207, 208 and the uniaxial magnetometer 223, 224, 225). In one or more embodiments, the area of the LCC 230 is less than or equal to the area of the faces 205 of the accelerometer sensor polyhedron 204. In one or more embodiments, the area of the LCC 230 is less than or equal to the area of the faces 222 of the magnetometer sensor polyhedron 221. In one embodiment, the LCC 230 has an area of approximately 0.42 $in^2$ (e.g., a length l of approximately 0.65 in and a width w of approximately 0.65 in) and a thickness T of approximately 0.08 in. Additionally, in one or more embodiments, each uniaxial MEMS accelerometer 206, 207, 208 is hermetically sealed under an inert gas to dampen unwanted oscillations. In one or more embodiments, each uniaxial MEMS magnetometer 223, 224, 225 is sealed under vacuum using encapsulated getters (e.g., less than approximately 1 mTorr) to preserve the high quality factors and the sensitivity of the uniaxial MEMS magnetometers 223, 224, 225. In one or more embodiments, the uniaxial MEMS accelerometers 206, 207, 208 and the uniaxial magnetometers 223, 224, 225 may be resonant-type MEMS sensors.

Figure 4A:
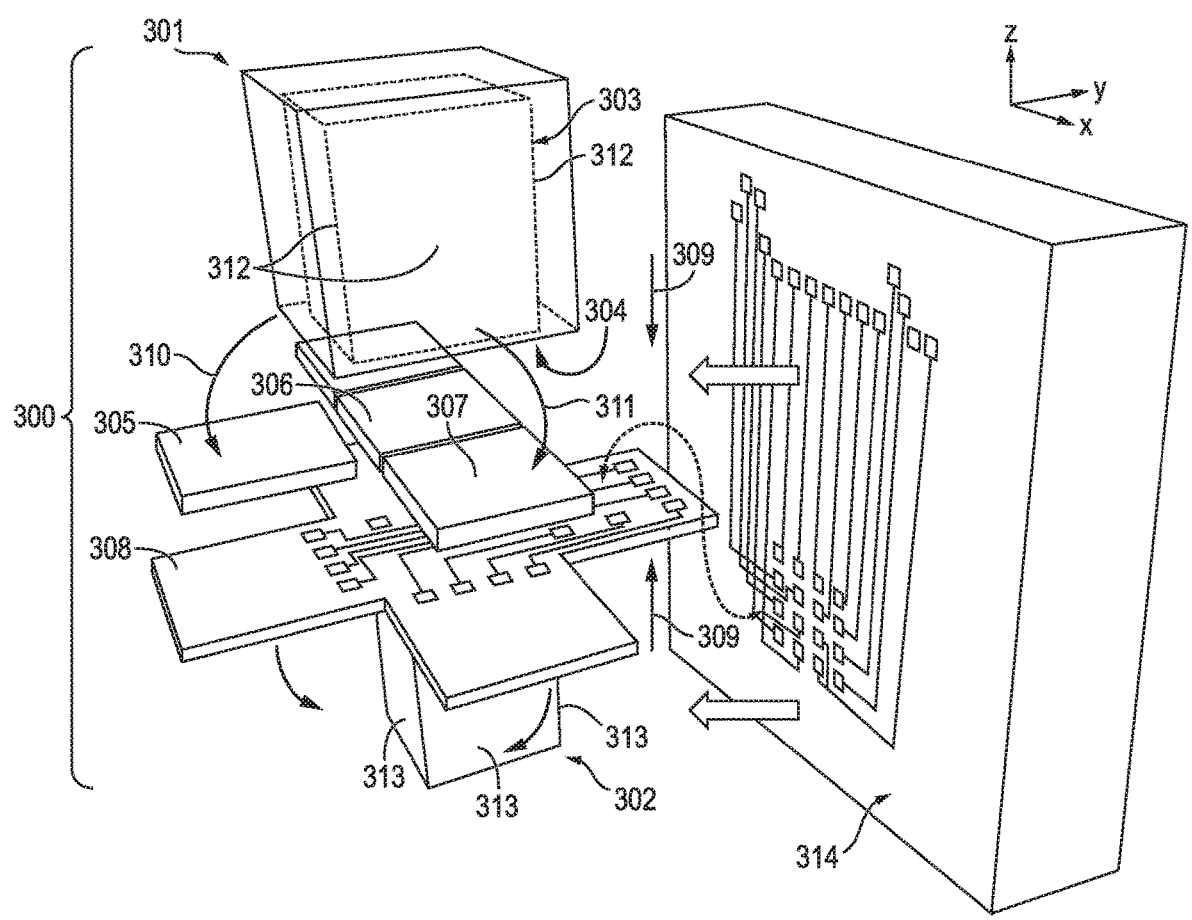
FIG. 4A is a system for manufacturing a MEMS-based sensor suite according to one embodiment of the present disclosure.

With reference now to FIG. 4A, a system 300 for manufacturing a MEMS-based sensor suite 200 according to one embodiment of the present disclosure includes a folding fixture 301 and a press 302. In the illustrated embodiment, the folding fixture 301 defines a cubic cavity 303 and the press 302 is a solid cubic anvil configured to extend at least partially into the cubic cavity 303. Additionally, in the illustrated embodiment, an outer surface (e.g., a face) of the folding fixture 301 defines an opening 304 (e.g., a square opening) in communication with the cubic cavity 303. In the illustrated embodiment, the opening 304 in the folding fixture 301 faces the press 302, and the press 302 is aligned with the opening 304 in the folding fixture 301. In the illustrated embodiment, the cubic cavity 303 in the folding fixture 301 has a volume of approximately 1 $in^3$ (e.g., a length of approximately 1 inch, a width of approximately 1 inch, and a depth of approximately 1 inch). In the illustrated embodiment, the opening 304 in the folding fixture 301 has an area of approximately 1 $in^2$ (e.g., a length of approximately 1 inch and a width of approximately 1 inch). Additionally, in the illustrated embodiment, the press 302 is slightly smaller than the cubic cavity 303 in the folding fixture 301 such that the press 302 is configured to extend at least partially into the cubic cavity 303 in the folding fixture 301 (e.g., the cubic cavity 303 in the folding fixture 301 is configured (sized and shaped) to accommodate the press 302).

To form a MEMS-based sensor suite according to one embodiment of the present disclosure, a series of sensors 305, 306, 307 are connected (e.g., soldered) to at least one circuit 308, and the sensors 305, 306, 307 connected to the at least one circuit 308 are positioned between the folding fixture 301 and the press 302. The press 302 is then moved (arrow 309) relative toward the folding fixture 301 (e.g., the press 302 is moved toward the folding fixture 301, the folding fixture 301 is moved toward the press 302, or the folding fixture 301 and the press 302 are both moved toward each other) such that the sensors 305, 306, 307 mounted on the at least one circuit 308 are pressed into the cubic opening 303 in the folding fixture 301 by the press 302. As the sensors 305, 306, 307 and the circuit 308 are pressed into the cubic opening 303 in the folding fixture 301 by the press 302, the sensors 305, 306, 307 and the circuit 308 are folded (arrows 310, 311) about x- and y-axes (e.g., axes 310, 311 in-plane with the opening 304 of the cubic chamber 303) such the sensors 305, 306, 307 and the circuit 308 conform to sidewalls 312 (e.g., three mutually orthogonal sidewalls) of the cubic chamber 303 and corresponding sidewalls 313 (e.g., three mutually orthogonal sidewalls) of the press 302. In the illustrated embodiment, after the sensors 305, 306, 307 and the circuit 308 have been pressed into the cubic chamber 303 by the press 302, the sensors 305, 306, 307 and the circuit 308 form a sensor polyhedron (e.g., the accelerometer sensor cube 204, the magnetometer sensor cube 212, or the gyroscope sensor cube 221 illustrated in FIG. 2) and the sensors 305, 306, 307 are positioned on three mutually orthogonal faces of the sensor cube. In one or more embodiments, after the sensors 305, 306, 307 and the at least one circuit 308 have been folded into the sensor cube, the circuit 308 may be coupled to the sidewalls 313 of the press 302 with an adhesive (e.g., an adhesive may be applied to the sidewalls 313 of the press 302 and/or a surface of the circuit 308 opposite the surface on which the sensors 305, 306, 307 are mounted). Accordingly, in one or more embodiments, the press 302 may form an interior support structure of the sensor cube. In one or more embodiments, the press 302 may be withdrawn from the cubic cavity 303 of the folding fixture 301 after pressing the sensors 305, 306, 307 and the circuit 308 into the cubic cavity 303 such that the sensor cube is hollow.

The sensors 305, 306, 307 may be any suitable type or kind of sensor depending on the type of information and signals the MEMS-based sensor suite is desired to generate or transmit and/or type of system into which the MEMS-based sensor suite is intended to be incorporated (e.g., a navigation system for a wellbore or an autonomous or semi-autonomous vehicle). For instance, in one embodiment, the sensors 305, 306, 307 may be uniaxial MEMS accelerometers. In another embodiment, the sensors 305, 306, 307 may be uniaxial MEMS magnetometers. In a further embodiment, the sensors 305, 306, 307 may be uniaxial MEMS gyroscopes. In one or more embodiments, the sensors 305, 306, 307 may be any suitable combination of uniaxial MEMS accelerometers, uniaxial MEMS magnetometers, and uniaxial MEMS gyroscopes. The system 300 illustrated in FIG. 4A may be utilized to manufacture the embodiment of the IMU 202, the compass 203, and the gyroscope 220 illustrated in FIG. 2.

Additionally, in the illustrated embodiment, the system 300 also includes a front-end board 314. The front-end board 314 may support one or more electronic components for processing the output signal of the sensors 305, 306, 307, such as, for instance, an amplifier, a signal filter, an analog-to-digital converter (ADC), or combinations thereof. The one or more sensor cubes may be mounted on the front-end board 314.

Figure 4B:
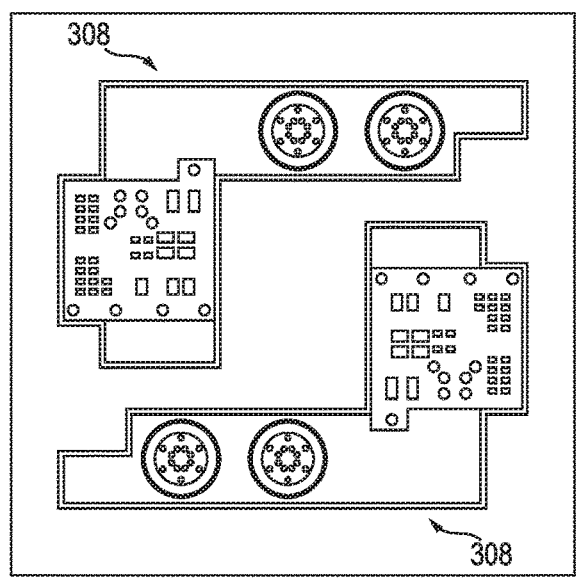
FIG. 4B is a front view of a rigid flex printed circuit board configured to be used during manufacturing of the MEMS-based sensor suite.

In one or more embodiments, the at least one circuit 308 may be one or more flex circuits or one or more rigid flex printed circuit boards. FIG. 4B illustrates a pair of rigid flex printed circuit boards 308 according to one embodiment of the present disclosure that are suitable for use with the manufacturing system 300 depicted in FIG. 4A.

Figure 5:
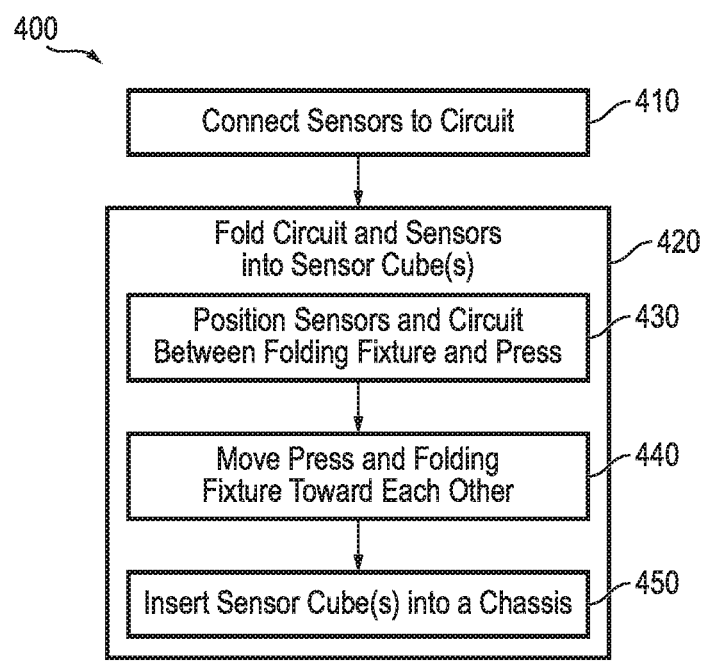
FIG. 5 is a flowchart illustrating tasks of forming a MEMS-based sensor suite according to one embodiment of the present disclosure.

FIG. 5 is a flowchart depicting tasks of a method 400 of manufacturing a MEMS-based sensor suite according to one embodiment of the present disclosure. In the embodiment illustrated in FIG. 5, the method includes a task 410 of connecting a series of sensors to a circuit and a task 420 of folding the circuit and the sensors into a sensor cube such that the sensors are on three mutually orthogonal faces of the sensor cube. The sensors may be any suitable type or kind of sensor depending on the type of information and signals the MEMS-based sensor suite is desired to generate and/or transmit and/or type of system into which the MEMS-based sensor suite is intended to be incorporated (e.g., a navigation system for a wellbore or an autonomous or semi-autonomous vehicle). For instance, in one embodiment, the sensors may be uniaxial MEMS accelerometers. In another embodiment, the sensors may be uniaxial MEMS magnetometers. In a further embodiment, the sensors may be uniaxial MEMS gyroscopes. In one or more embodiments, the sensors may be any suitable combination of uniaxial MEMS accelerometers, uniaxial MEMS magnetometers, and uniaxial MEMS gyroscopes. The above-described tasks 410, 420 of connecting the sensors to the circuit and folding the sensors and the circuit into a sensor cube may be repeated to form each of the different sensors units of the MEMS-based sensor suite (e.g., the above-described tasks may be performed to form an IMU including an accelerometer sensor cube, and then the tasks may be repeated to form a compass including a gyroscope sensor cube, or vice versa).

In one or more embodiments, the task 420 of folding the circuit and the sensors into the sensor cube (e.g., the accelerometer sensor cube, the magnetometer sensor cube, or the gyroscope sensor cube) includes a task 430 of positioning the sensors connected to the circuit (e.g., the flex circuit or the rigid flex printed circuit board) between a folding fixture defining a cubic cavity and a press configured to extend at least partially into the cubic cavity of the folding fixture. In one or more embodiments, the task 410 of folding the circuit into the sensor cube also includes a task 440 of moving the press and the folding fixture relatively toward each other and pressing the plurality of sensors and the circuit into the cubic cavity in the folding fixture, which bends and conforms the circuits to a shape of the cubic cavity in the folding fixture and the exterior shape of the press.

In one or more embodiments, the method 400 may include a task 450 of inserting the one or more sensor polyhedrons (e.g., the accelerometer sensor cube 204, the magnetometer sensor cube 212, or the gyroscope sensor cube 221 illustrated in FIG. 2) into a housing or a chassis.

While this invention has been described in detail with particular references to exemplary embodiments thereof, the exemplary embodiments described herein are not intended to be exhaustive or to limit the scope of the invention to the exact forms disclosed. Persons skilled in the art and technology to which this invention pertains will appreciate that alterations and changes in the described structures and methods of assembly and operation can be practiced without meaningfully departing from the principles, spirit, and scope of this invention, as set forth in the following claims. Although relative terms such as "outer," "inner," "upper," "lower," and similar terms have been used herein to describe a spatial relationship of one element to another, it is understood that these terms are intended to encompass different orientations of the various elements and components of the invention in addition to the orientation depicted in the figures. Additionally, as used herein, the term "substantially," "about," and similar terms are used as terms of approximation and not as terms of degree, and are intended to account for the inherent deviations in measured or calculated values that would be recognized by those of ordinary skill in the art. Moreover, the tasks described above may be performed in the order described or in any other suitable sequence. Additionally, the methods described above are not limited to the tasks described. Instead, for each embodiment, one or more of the tasks described above may be absent and/or additional tasks may be performed. Furthermore, as used herein, when a component is referred to as being "on" another component, it can be directly on the other component or components may also be present therebetween. Moreover, when a component is component is referred to as being "coupled" to another component, it can be directly attached to the other component or intervening components may be present therebetween.

What is claimed is:

1. A MEMS sensor suite, comprising:
   a three axis accelerometer, comprising:
      an accelerometer sensor polyhedron comprising a plurality of faces;
      a plurality of MEMS axial accelerometers on three faces of the plurality of faces of the accelerometer sensor polyhedron; and
   a three axis magnetometer, comprising:
      a magnetometer sensor polyhedron comprising a plurality of faces; and
      a plurality of axial magnetometers on three faces of the plurality of faces of the magnetometer sensor polyhedron,
   wherein the MEMS axial accelerometers and the axial magnetometers are resonant-type MEMS sensors.

2. The MEMS sensor suite of claim 1, wherein:
   the accelerometer sensor polyhedron is a cube, and
   the three faces of the accelerometer sensor polyhedron are three mutually orthogonal faces.

3. The MEMS sensor suite of claim 2, wherein the cube of the three axis accelerometer has a volume of about 1 in$^3$.

4. The MEMS sensor suite of claim 1, wherein:
   the magnetometer sensor polyhedron is a cube, and
   the three faces of the magnetometer sensor polyhedron are three mutually orthogonal faces.

5. The MEMS sensor suite of claim 4, wherein the cube of the three axis magnetometer has a volume of about 1 in$^3$.

6. The MEMS sensor suite of claim 1, wherein each MEMS axial accelerometer of the plurality of MEMS axial accelerometers has an area of about 0.65 in×0.65 in.

7. The MEMS sensor suite of claim 1, wherein each axial magnetometer of the plurality of axial magnetometers has an area of about 0.65 in×0.65 in.

8. The MEMS sensor suite of claim 1, further comprising:
   a three axis gyroscope, comprising:
      a gyroscope sensor polyhedron comprising a plurality of faces; and
      a plurality of axial gyroscopes on three faces of the plurality of faces of the gyroscope sensor polyhedron,
   wherein the axial gyroscopes are resonant-type MEMS sensors.

9. The MEMS sensor suite of claim 8, wherein:
   the gyroscope sensor polyhedron is a cube, and
   the three faces of the gyroscope sensor polyhedron are three mutually orthogonal faces.

10. The MEMS sensor suite of claim 1, wherein the accelerometer sensor polyhedron comprises a flex circuit or a rigid flex printed circuit board.

11. The MEMS sensor suite of claim 10, wherein the accelerometer sensor polyhedron is the rigid flex printed circuit board, and wherein the plurality of MEMS axial accelerometers are electrically connected together by signal routing wires extending through flexible hinges of the rigid flex printed circuit board.

12. The MEMS sensor suite of claim 1, wherein the magnetometer sensor polyhedron comprises a flex circuit or a rigid flex printed circuit board.

13. The MEMS sensor suite of claim 12, wherein the magnetometer sensor polyhedron is the rigid flex printed circuit board, and wherein the plurality of axial magnetometers are electrically connected together by signal routing wires extending through flexible hinges of the rigid flex printed circuit board.

14. The MEMS sensor suite of claim 1, further comprising a front-end board, wherein the accelerometer sensor polyhedron and the magnetometer sensor polyhedron are mounted on the front-end board.

15. The MEMS sensor suite of claim 1, further comprising a plurality of electronic components on the three faces of the accelerometer sensor polyhedron, wherein the electronic components are selected from the group of electronic components consisting of signal amplifiers, filters, and analog-to-digital converters.

16. The MEMS sensor suite of claim 1, further comprising a plurality of electronic components on the three faces of the magnetometer sensor polyhedron, wherein the electronic components are selected from the group of electronic components consisting of signal amplifiers, filters, and analog-to-digital converters.

17. A method of manufacturing a MEMS sensor suite, the method comprising:
    connecting a plurality of sensors to a circuit; and
    folding the circuit into a sensor polyhedron comprising a plurality of faces, and wherein the plurality of sensors are on three faces of the plurality of faces of the sensor polyhedron,
    wherein the folding the circuit into the sensor polyhedron comprises:
        positioning the plurality of sensors connected to the circuit between a folding fixture and a press, the folding fixture defining a cubic cavity and an opening in communication with the cubic cavity; and
        moving the press and the folding fixture relatively toward each other and pressing the plurality of sensors and the circuit into the cubic cavity through the opening in the folding fixture, the pressing conforming the circuit to a shape of the cubic cavity.

18. The method of claim 17, wherein the sensor polyhedron comprises a cube, and wherein the three faces are three mutually orthogonal faces.

19. The method of claim 17, wherein the circuit is a flex circuit or a rigid flex printed circuit board.

20. The method of claim 17, wherein the plurality of sensors are selected from the group consisting of a plurality of axial accelerometers, a plurality of axial magnetometers, a plurality of gyroscopes, and combinations thereof.

21. The method of claim 17, wherein the press is a solid cube having a size smaller than a size of the cubic cavity in the folding fixture.

22. The method of claim 17, wherein the cubic cavity in the folding fixture has a volume of about 1 in$^3$.

23. The MEMS sensor suite of claim 1, further comprising a housing, wherein the three axis accelerometer and the three axis magnetometer are stacked within the housing.

24. The MEMS sensor suite of claim 1, wherein the three axis magnetometer is separate from the three axis accelerometer, and wherein a size of the three axis magnetometer is substantially equal to a size of the three axis accelerometer.

* * * * *